United States Patent [19]
Akada et al.

[11] Patent Number: 5,476,565
[45] Date of Patent: Dec. 19, 1995

[54] DICING-DIE BONDING FILM

[75] Inventors: Yuzo Akada; Koji Akazawa; Keiji Nakamoto, all of Osaka, Japan

[73] Assignee: Nitto Denko Corporation, Osaka, Japan

[21] Appl. No.: 180,385

[22] Filed: Jan. 12, 1994

Related U.S. Application Data

[62] Division of Ser. No. 998,847, Dec. 30, 1992, Pat. No. 5,304,418.

[30] Foreign Application Priority Data

Dec. 30, 1991 [JP] Japan ................................. 3-358886

[51] Int. Cl.⁶ .................................................. B32B 31/00
[52] U.S. Cl. ................... 156/235; 156/272.2; 156/275.5
[58] Field of Search ................................. 156/235, 238, 156/275.5

[56] References Cited

U.S. PATENT DOCUMENTS

| | | |
|---|---|---|
| 4,913,960 | 4/1990 | Kuroda et al. . |
| 4,961,804 | 10/1990 | Aurichio . |
| 4,965,127 | 10/1990 | Ebe et al. . |
| 4,968,559 | 11/1990 | Kuroda et al. . |
| 4,999,242 | 3/1991 | Ishiwata et al. . |
| 5,110,388 | 5/1992 | Komiyama et al. ................ 156/275.5 |
| 5,118,567 | 6/1992 | Komiyama et al. . |
| 5,187,007 | 2/1993 | Ebe et al. . |

FOREIGN PATENT DOCUMENTS

| | | |
|---|---|---|
| 0134606 | 3/1985 | European Pat. Off. . |
| 157508 | 11/1985 | European Pat. Off. . |
| 0194706 | 9/1986 | European Pat. Off. . |
| 0253444 | 1/1988 | European Pat. Off. . |
| 0359373 | 3/1990 | European Pat. Off. . |
| 62-069635 | 3/1987 | Japan . |
| 62-079649 | 4/1987 | Japan . |

OTHER PUBLICATIONS

Patent Abstracts of Japan, vol. 15, No. 185 (E–1066) May 13, 1991 & JP-A-30 46 242 (Fujitsu Ltd).
Patent Abstracts of Japan, vol. 14, No. 553 (E–1010) Dec. 7, 1990 & JP-A-22 38 641 (Fujitsu Ltd).
Patent Abstracts of Japan, vol. 12, No. 500 (E–699) Dec. 27, 1988 & JP-A-63 211 644 (NEC Home Electronics Ltd).
Japanese Patent Abstract, J02248064–A.
Japanese Patent Abstract, J86056264–B.
Japanese Patent Abstract, J83033909–B.
Japanese Patent Abstract, J82054068–B.
Japanese Patent Abstract, JP–60196956–A.

*Primary Examiner*—David A. Simmons
*Attorney, Agent, or Firm*—Sughrue, Mion, Zinn, Macpeak & Seas

[57] ABSTRACT

A dicing-die bonding film comprising an ultraviolet-transmitting substrate having provided thereon an ultraviolet-curable pressure-sensitive adhesive layer and an adhesive layer in this order, the pressure-sensitive adhesive layer having been partly ultraviolet-cured to have cured parts and uncured parts. The film has a well-balanced combination of a holding power for supporting a semiconductor wafer during dicing and release properties for enabling cut chips to be easily released together with the adhesive layer so that even large-sized chips as larger than 10 mm×10 mm can easily be picked up.

1 Claim, 1 Drawing Sheet

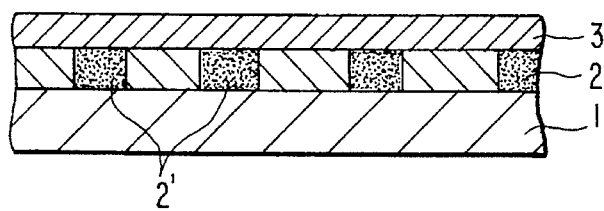
FIG. 1
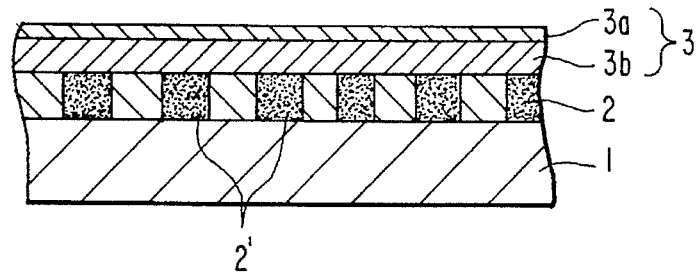
FIG. 2
FIG. 3
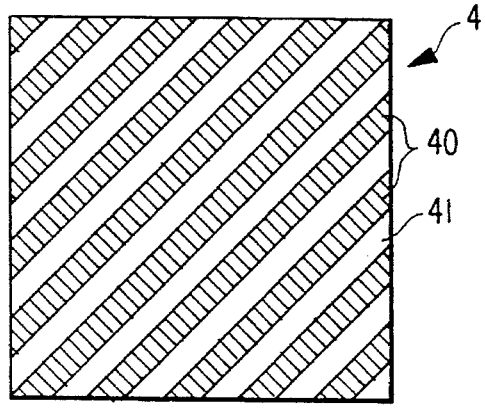
FIG. 4
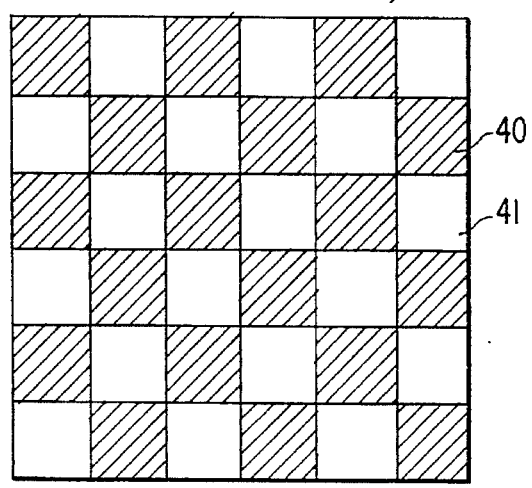
FIG. 5
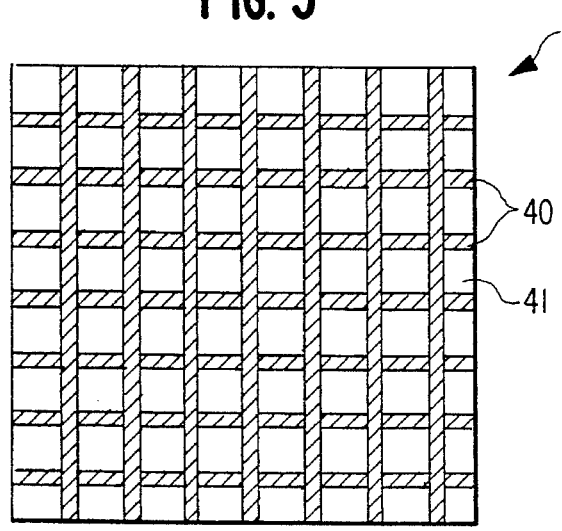

DICING-DIE BONDING FILM

This is a divisional of application Ser. No. 07/998,847 filed Dec. 30, 1992, now U.S. Pat. No. 5,304,418.

FIELD OF THE INVENTION

This invention relates to a dicing-die bonding film which can be used for dicing a semiconductor wafer into chips and fixing each chip picked up to an adherend such as a lead flame.

BACKGROUND OF THE INVENTION

In circuit pattern formation, a semiconductor wafer, if desired with its thickness adjusted by back side polishing, is cut into chips (dicing step), and the separated chips thus formed are fixed to an adherend such as a lead frame with an adhesive (mounting step) and then subjected to a bonding step. After the dicing step, the semiconductor wafer is usually cleaned at an appropriate liquid pressure, generally about 2 $kg/cm^2$, to remove the offcut, etc.

Where an adhesive is separately applied to a lead frame or the chip in the treatment step, it is difficult to uniformly apply the adhesive, and the application of the adhesive needs a special apparatus and much time. Therefore, a dicing-die bonding film which adheres and supports a semiconductor wafer in the dicing step and also provides an adhesive layer for chip fixing in the mounting step has been proposed as disclosed in JP-A-60-57642 (corresponding to U.S. Pat. No. 4,961,804) (the term "JP-A" as used herein means an "unexamined published Japanese patent application").

The dicing-die bonding film proposed comprises a substrate having provided thereon a releasable electrically conductive adhesive layer. After a semiconductor wafer is cut into chips while being supported by the adhesive layer of the dicing-die bonding film, the substrate is stretched to release the chips along with the adhesive layer. The individual chips with the adhesive layer are then picked up and fixed to an adherend such as a lead frame via the adhesive layer.

It is required for a film of this type to exhibit satisfactory holding power for supporting a semiconductor wafer and satisfactory release properties so that the chips may be released together with the electrically conductive adhesive layer. However, it has never been easy to satisfy these two requirements in good balance. Where, in particular, a high holding power is needed as in a dicing system using a rotary wheel cutter, it has been difficult to obtain a film having such a high holding power in good balance with the release properties.

In order to overcome this problem, various improvements have been proposed to date. For example, JP-A-2-248064 proposes a film having an ultraviolet-curable pressure-sensitive adhesive layer between a substrate and an adhesive layer. The ultraviolet-curable layer is cured by ultraviolet irradiation after dicing to reduce its tack to the adhesive layer so that the chips may be released with ease. However, the film is still unsatisfactory in maintaining a balance between holding power during dicing and release properties after the dicing. For example, large-sized chips as larger than 10 mm×10 mm could not easily be picked up with a general die bonder.

SUMMARY OF THE INVENTION

An object of the present invention is to provide a dicing-die bonding film comprising a substrate and an adhesive layer, which has a well-balanced combination of a holding power for supporting a semiconductor wafer during dicing and release properties for enabling cut chips to be easily released together with the adhesive layer so that even large-sized chips as larger than 10 mm×10 mm can easily be picked up.

As a result of extensive investigations, the inventors have now found that the above object of this invention is accomplished by a dicing-die bonding film comprising a substrate and an adhesive layer with an ultraviolet-curable pressure-sensitive adhesive layer being interposed therebetween, the pressure-sensitive adhesive layer having been partly ultraviolet-cured beforehand to have its tack moderately adjusted. The dicing-die bonding film having such a structure satisfies both holding power during dicing and release properties at the time of pickup of chips in good balance and makes it feasible to easily release even large-sized chips exceeding 10 mm×10 mm without causing any trouble during dicing. The present invention has been completed based on this finding.

That is, the present invention relates to a dicing-die bonding film comprising a substrate having provided thereon an ultraviolet-curable pressure-sensitive adhesive layer and an adhesive layer in this order, the pressure-sensitive adhesive layer having been partly ultraviolet-cured.

BRIEF DESCRIPTION OF THE DRAWING

FIG. 1 shows a cross section of one embodiment of the dicing-die bonding film according to the present invention.

FIG. 2 shows a cross section of another embodiment of the dicing-die bonding film according to the present invention.

FIG. 3 shows a plane view of one example of a photomask to be used in the preparation of the dicing-die bonding film according to the present invention.

FIG. 4 shows a plane view of another example of a photomask to be used in the preparation of the dicing-die bonding film according to the present invention.

FIG. 5 shows a plane view of still another example of a photomask to be used in the preparation of the dicing-die bonding film according to the present invention.

DETAILED DESCRIPTION OF THE INVENTION

The dicing-die bonding film of the present invention will be explained by referring to the accompanying drawing. In FIG. 1 illustrating one embodiment of the film, numerals 1, 2, 2', and 3 indicate a substrate, an ultraviolet-curable pressure-sensitive adhesive layer, ultraviolet-cured part of pressure-sensitive adhesive layer 2, and an adhesive layer, respectively.

Substrate 1 is a base for maintaining strength of a dicing-die bonding film and is generally made of plastics, such as polyethylene, polypropylene, polyester, polycarbonate, an ethylene-vinyl acetate copolymer, an ethylene-propylene copolymer, an ethylene-ethyl acrylate copolymer, polyvinyl chloride, and a mixture thereof.

In order to endow the substrate with antistatic properties, an electrically conductive deposit layer having a thickness of from about 30 to 500 Å comprising a metal, a metallic alloy, or an oxide thereof, etc. may be provided on substrate 1. A laminate composed of a plurality of such antistatic substrates or a laminate composed of such an antistatic substrate and other films may also be employed.

The thickness of substrate 1 is appropriately selected usually from a range of 5 to 200 μm. Substrate 1 comprises an ultraviolet-transmitting material so that ultraviolet-curable pressure-sensitive adhesive layer 2 provided thereon may be ultraviolet-cured from the side of substrate 1.

Ultraviolet-curable pressure-sensitive adhesive layer 2 is a layer which increases the degree of crosslinking upon exposure to ultraviolet light to reduce its tack and simultaneously produces a stress through cure shrinkage. Pressure-sensitive adhesive layer 2 functions to support adhesive layer 3, which functions to fix separated chips to an adherend such as a lead frame, while keeping well-balanced adhesion and release properties. That is, pressure-sensitive adhesive layer 2 sticks to adhesive layer 3 with sufficient tack before ultraviolet irradiation but undergoes a considerable tack reduction upon ultraviolet irradiation to make adhesive layer easily be released when chips are picked up.

Adhesives which can be used for formation of pressure-sensitive adhesive layer 2 include those disclosed in JP-A-60-196956, such as rubber-based or acrylic pressure-sensitive adhesives having compounded therewith a photopolymerizable compound, such as an addition-polymerizable compound containing at least two unsaturated bonds or an alkoxysilane containing an epoxy group, and a photopolymerization initiator, such as a carbonyl compound, an organosulfur compound, a peroxide, an amine, or an onium salt compound.

Examples of the addition-polymerizable compound containing at least two unsaturated bonds include esters or oligomeric esters of acrylic or methacrylic acid with a polyhydric alcohol, epoxy compounds, and urethane compounds.

The photopolymerizable compound and photopolymerization initiator are usually compounded in amounts of from 10 to 500 parts by weight and from 0.05 to 20 parts by weight, respectively, per 100 parts by weight of a base polymer. If desired, the adhesive may further comprise a functional crosslinking agent containing one or more epoxy groups per molecule, such as ethylene glycol diglycidyl ether, to thereby increase crosslinking efficiency.

Acrylic polymers to be used in the acrylic pressure-sensitive adhesives include those commonly employed as disclosed in, e.g., JP-B-57-54068 and JP-B-58-33909 (the term "JP-B" as used herein means an "examined published Japanese patent application") and, in addition, those containing a radical reactive unsaturated group in the side chain thereof or containing an epoxy group in the molecule thereof as disclosed in JP-B-61-56264.

The thickness of ultraviolet-curable pressure-sensitive adhesive layer 2 is not particularly limited but is suitably in the range of from 3 to 50 μm.

The present invention is characterized in that pressure-sensitive adhesive layer 2 is partly cured by ultraviolet irradiation to form ultraviolet-cured parts 2' as shown in FIG. 1. The term "partly cured" means that pressure-sensitive adhesive layer 2 is cured in parts but not that the entire area of pressure-sensitive adhesive layer 2 is semi-cured. In other words, some parts of pressure-sensitive adhesive layer 2 have been ultraviolet-cured to have reduced tack whereas the other parts remain uncured and exhibit sufficient tack.

Partial ultraviolet curing can be carried out by, for example, irradiating ultraviolet rays to a substrate and an ultraviolet-curable pressure-sensitive adhesive layer through a photomask or irradiating ultraviolet rays in spots. Ultraviolet irradiation may be effected after forming adhesive layer 3 on pressure-sensitive adhesive layer 2. Further, an ultraviolet-curable pressure-sensitive adhesive layer may be once formed on a separator, partly ultraviolet-cured, and then transferred onto a substrate.

The area ratio of ultraviolet-cured parts 2' is not particularly limited but in general ranges from 5 to 95% of the total area. The ultraviolet-cured parts may form any pattern, such as a line pattern (stripes), a polka-dot pattern, a lattice pattern, a checkered pattern, or a crow-footed pattern.

Where there is a fear of curing hinderance by oxygen, it is desirable to block oxygen (air) from the surface of ultraviolet-curable pressure-sensitive adhesive layer 2 by any means. For example, the surface of pressure-sensitive adhesive layer 2 may be covered with a separator, or ultraviolet irradiation may be effected in a nitrogen atmosphere.

Ultraviolet-cured parts 2' exhibit no substantial tack to adhesive layer 3 provided thereon, thus contributing to the adjustment of initial tack of the film as a whole. When the chips formed by dicing are picked up, the entire area of pressure-sensitive adhesive layer 2 is cured by ultraviolet irradiation. Tack reduction achieved as a result of the entire ultraviolet curing is greater than that reached when the pressure-sensitive adhesive layer has no previously cured parts 2'. In addition, ultraviolet-cured parts 2' trigger the release of adhesive layer 3, making pickup of chips very easier.

Adhesive layer 3 combines the function of supporting a semiconductor wafer during dicing and the function of fixing the separated chips to an adherend such as a lead frame. The thickness of adhesive layer 3 is not particularly limited but generally ranges from about 1 to 200 μm. If desired, various electrically conductive substances, e.g., a fine powder of aluminum, copper, silver, gold, palladium or carbon, or thermally conductive substances, e.g., a fine powder of alumina, may be incorporated into adhesive layer 3 to impart various optional characteristics thereto.

Adhesives which can be used for formation of adhesive layer 3 may be of any type of adhesives, inclusive of a thermoplastic type, a thermosetting type, and a mixed type thereof, as long as they exhibit tackiness in a relatively low temperature of 120° C. or less or capable of melting in that temperature to display the above-described holding function and fixing function. In order to obtain adhesive strength in high temperatures to an adherend such as a lead frame, a thermosetting type adhesive or a mixture of a thermosetting type adhesive and a thermoplastic component is preferred.

Adhesive layer 3 does not need to be a single layer and may have a multi-layered structure, such as a double layer structure composed of first adhesive layer 3a and second adhesive layer 3b as shown in FIG. 2 (other numerals in FIG. 2 are the same as in FIG. 1). The layer structure, either a single layer structure or a multiple layer structure, may be decided taking the holding-fixing function and the release properties on picking up into consideration.

The dicing-die bonding film having the above-described construction is usually preserved with a separator temporarily adhered on adhesive layer 3. The separator is stripped off on use.

Usage of the dicing-die bonding film, from which a separator is stripped, is explained below. A semiconductor wafer is held on adhesive layer 3 by adhesion and cut into chips along with adhesive layer 3 by an appropriate means, such as a rotary wheel cutter. The entire area of pressure-sensitive adhesive layer 2 is then cured by ultraviolet irradiation from the side of substrate 1 to reduce or eliminate its adhesiveness to adhesive layer 3. Then the separated chips are released and picked up with adhesive layer 3 on it from pressure-sensitive adhesive layer 3 and adhered to an adherend, such as a lead frame or a base board, via adhesive layer 3. Where adhesive layer 3 is of thermosetting type, it fixes the chip to the adherend through heat curing to provide satisfactory heat-resistant bonding strength.

As described above, since the ultraviolet-curable pressure-sensitive adhesive layer sandwiched in between a substrate and an adhesive layer has been partly cured beforehand to have its tack moderately adjusted, the dicing-die bonding film of the present invention exhibits a holding power during dicing and release properties during picking up of chips in good balance. Even when applied to such large-sized chips as exceeding 10 mm×10 mm, the film achieves easy release and pickup of chips without involving any trouble in the dicing step.

The present invention is now illustrated in greater detail with reference to Examples, but it should be understood that the present invention is not construed as being limited thereto. All the parts are by weight unless otherwise indicated.

EXAMPLE 1

A toluene solution of an ultraviolet-curable acrylic pressure-sensitive adhesive comprising 100 parts of a butyl acrylate/acrylonitrile/acrylic acid copolymer (100/5/5 by weight; weight average molecular weight: 300,000), 20 parts of dipentaerythritol monohydroxypentaacrylate as a photopolymerizable compound, and 1 part of α-hydroxycyclohexyl phenyl ketone as a photopolymerization initiator was coated on a 60 μm thick polyvinyl chloride film and dried to form a pressure-sensitive adhesive layer having a thickness of 20 μm. The resulting film composed of a substrate and an ultraviolet-curable pressure-sensitive adhesive layer is designated adhesive film A.

A methyl ethyl ketone solution containing a carboxyl-modified acrylonitrile-butadiene copolymer rubber, a bisphenol A type epoxy resin (epoxy equivalent: 450), a novolak type phenol resin (softening point: 75° C.), and 2-methylimidazole at a weight ratio of 100/60/30/1 was coated on a 50 μm thick release-coated polyester film as a separator and dried at 100° C. for 10 minutes to form a first adhesive layer having a thickness of 10 μm. The resulting film composed of a separator and a first adhesive layer is designated adhesive film B.

A dimethylacetamide solution containing polyether imide, a bisphenol A type epoxy resin (epoxy equivalent: 185), a novolak type phenol resin (softening point: 75° C.), and 2-methylimidazole at a weight ratio of 100/50/30/0.5 was coated on a 50 μm thick release-coated polyester film as a separator and dried at 130° C. for 10 minutes under reduced pressure of 0.5 mmHg to form a second adhesive layer having a thickness of 20 μm. The resulting film composed of a separator and a second adhesive layer is designated adhesive film C.

A 25 μm thick release-coated polyester separator film was laminated on the pressure-sensitive adhesive layer of adhesive film A. Photomask 4 having a striped pattern formed of 1 mm-wide ultraviolet screening stripes 40 and 1 mm-wide ultraviolet transmitting stripes 41 as shown in FIG. 3 was placed thereon, and ultraviolet rays were irradiated to a dose of 200 mJ/cm² on the pressure-sensitive adhesive layer via the photomask to thereby cure the pressure-sensitive adhesive layer in the parts corresponding to stripes 41.

Photomask 4 and the separator were removed, and adhesive film C was contact bonded on the partly cured pressure-sensitive adhesive layer with the second adhesive layer thereof facing inside. Adhesive film B was further contact bonded thereon with its first second adhesive layer facing inside to obtain a dicing-die bonding film.

EXAMPLE 2

A dicing-die bonding film was prepared in the same manner as in Example 1, except for replacing polyether imide with polyether sulfone in the formation of the second adhesive layer of adhesive film C.

EXAMPLE 3

A dicing-die bonding film was prepared in the same manner as in Example 1, except for replacing polyether imide with polyether sulfone and replacing dimethylacetamide with methyl ethyl ketone in the formation of the second adhesive layer of adhesive film C.

EXAMPLE 4

A dicing-die bonding film was prepared in the same manner as in Example 1, except for using photomask 4 shown in FIG. 4 in which ultraviolet screening parts 40 and ultraviolet transmitting parts 41 each having a 1 mm-square shape were arranged to form a checkered pattern.

EXAMPLE 5

A dicing-die bonding film was prepared in the same manner as in Example 1, except for using photomask 4 shown in FIG. 5 in which ultraviolet screening parts 40 having a width of 0.5 mm were arranged to form a lattice skeleton and ultraviolet transmitting parts 41 corresponded to the 1.5 mm-squares surrounded by the lattice skeleton.

COMPARATIVE EXAMPLE 1

A dicing-die bonding film was prepared in the same manner as in Example 1, except that the partial ultraviolet curing of the pressure-sensitive adhesive layer was not carried out.

Each of the dicing-die bonding films obtained in the above Examples and Comparative Example was evaluated in actual dicing-die bonding of a semiconductor wafer as follows.

The separator was stripped from the dicing-die bonding film. A mirror-finished wafer having a diameter of 4 in. and a thickness of 370 μm was contact bonded to the thus exposed first adhesive layer with a roll at 60° C. and cut by full dicing into 3 mm-square chips. The pressure-sensitive adhesive layer was cured by ultraviolet irradiation from the substrate side. Each chip was pushed up from the substrate side with an ejector needle and picked up. The thus obtained chip was adhered to a 42 alloy frame at 200° C., followed by post curing at 200° C. for 30 minutes.

In each case, the film caused no troubles during the dicing step, such as chip scattering, and the separated chips with the second adhesive layer on it could easily be released from the pressure-sensitive adhesive layer and picked up. Further, the chips fixed onto the flame showed an adhesive strength under shear of 15 kg or higher at room temperature and 1.5 kg or higher at 200° C. in each case, which is sufficient for carrying out the subsequent chip processing steps.

Next, the same testing was repeated, except that the wafer on each film was cut by full dicing into 5 mm-square chips, 10 mm-square chips, or 15 mm-square chips. As a result, in the case of using the films of Examples 1 to 5, the dicing step could be effected without any trouble, and every chip could be picked up satisfactorily, whereas the 10 mm-square chips and 15 mm-square chips could not be picked up from the film of Comparative Example 1.

As is apparent from these test results, the dicing-die bonding film according to the present invention, in which the pressure-sensitive adhesive layer sandwiched in between a substrate and an adhesive layer has previously been ultraviolet-cured in parts, enables separated chips of various sizes to be satisfactorily picked up.

While the invention has been described in detail and with reference to specific examples thereof, it will be apparent to one skilled in the art that various changes and modifications can be made therein without departing from the spirit and scope thereof.

What is claimed is:

1. A process for dicing-die bonding comprising the steps of:

bonding a semiconductor wafer to an adhesive layer of a dicing-die bonding film comprising an ultraviolet-transmitting substrate having provided thereon an ultraviolet-curable pressure-sensitive adhesive layer and an adhesive layer in this order, said pressure-sensitive adhesive layer having been partly ultraviolet-cured, cutting the wafer together with the adhesive layer of the dicing-die bonding film to form chips, irradiating ultraviolet light on the entire area of the ultraviolet-curable pressure-sensitive adhesive layer through the ultraviolet-transmitting substrate to reduce or eliminate the adhesiveness of the pressure-sensitive adhesive layer to the adhesive layer provided thereon, and releasing and picking up the separated chips with the adhesive layer on it from the pressure-sensitive adhesive layer and adhering the chips to an adherend via the adhesive layer.

* * * * *